(12) United States Patent
Pitkethly et al.

(10) Patent No.: US 7,768,295 B2
(45) Date of Patent: Aug. 3, 2010

(54) ADVANCED REPEATER UTILIZING SIGNAL DISTRIBUTION DELAY

(76) Inventors: Scott Pitkethly, 435 Avenue Del Ora, Redwood City, CA (US) 94062; Robert Paul Masleid, 17266 Eaton La., Monte Sereno, CA (US) 95930

( * ) Notice: Subject to any disclaimer, the term of this patent is extended or adjusted under 35 U.S.C. 154(b) by 0 days.

(21) Appl. No.: 12/124,136

(22) Filed: May 20, 2008

(65) Prior Publication Data

US 2008/0218215 A1 Sep. 11, 2008

Related U.S. Application Data

(63) Continuation of application No. 11/171,845, filed on Jun. 30, 2005, now Pat. No. 7,375,556, which is a continuation-in-part of application No. 10/864,271, filed on Jun. 8, 2004, now Pat. No. 7,336,103, which is a continuation-in-part of application No. 10/879,807, filed on Jun. 28, 2004, now Pat. No. 7,142,018.

(51) Int. Cl.
*H03K 19/003* (2006.01)
*H03K 19/094* (2006.01)

(52) U.S. Cl. .......................................... 326/23; 326/27

(58) Field of Classification Search .................... 326/23, 326/27, 83, 86; 327/108, 155
See application file for complete search history.

(56) References Cited

U.S. PATENT DOCUMENTS

| | | | |
|---|---|---|---|
| 3,991,380 A | 11/1976 | Pryor | |
| 4,498,021 A | 2/1985 | Uya | |
| 4,700,089 A | 10/1987 | Fujii et al. | |
| 4,739,252 A | 4/1988 | Malaviya et al. | |
| 4,760,279 A | 7/1988 | Saito et al. | |
| 4,779,013 A * | 10/1988 | Tanaka | 326/27 |
| 5,039,893 A | 8/1991 | Tomisawa | |
| 5,128,560 A | 7/1992 | Chern et al. | |
| 5,166,555 A | 11/1992 | Kano | |
| 5,227,679 A | 7/1993 | Woo | |
| 5,264,738 A | 11/1993 | Veendrick et al. | |
| 5,297,086 A | 3/1994 | Nasu et al. | |
| 5,319,260 A * | 6/1994 | Wanlass | 326/26 |
| 5,410,278 A | 4/1995 | Itoh et al. | |
| 5,414,312 A | 5/1995 | Wong | |

(Continued)

FOREIGN PATENT DOCUMENTS

EP   1398639   3/2004

(Continued)

OTHER PUBLICATIONS

Ryohei Kaneda, Translation of Japanese Kokai Patent Application No. Hei 3{1991}-89624, publication date: Apr. 26, 1991, pp. 1-6.

(Continued)

*Primary Examiner*—Daniel D Chang

(57) ABSTRACT

An advanced repeater utilizing signal distribution delay. In accordance with a first embodiment of the present invention, such an advanced repeater circuit comprises an output stage for driving an output signal line responsive to an input signal and a feedback loop coupled to said output signal line for changing state of said output stage subsequent to a delay after a transition of said output signal. The delay is due to transmission line effects of said output signal line.

15 Claims, 2 Drawing Sheets

U.S. PATENT DOCUMENTS

| | | |
|---|---|---|
| 5,455,521 A | 10/1995 | Dobbelaere |
| 5,467,038 A | 11/1995 | Motley et al. |
| 5,497,105 A | 3/1996 | Oh et al. |
| 5,525,616 A | 6/1996 | Platt et al. |
| 5,568,103 A | 10/1996 | Nakashima et al. |
| 5,587,665 A | 12/1996 | Jiang |
| 5,594,360 A | 1/1997 | Wojciechowski |
| 5,610,548 A | 3/1997 | Masleid |
| 5,614,845 A | 3/1997 | Masleid |
| 5,656,963 A | 8/1997 | Masleid et al. |
| 5,677,650 A | 10/1997 | Kwasniewski et al. |
| 5,680,359 A | 10/1997 | Jeong |
| 5,698,994 A * | 12/1997 | Tsuji ........................... 326/83 |
| 5,739,715 A | 4/1998 | Rawson |
| 5,764,110 A | 6/1998 | Ishibashi |
| 5,767,700 A | 6/1998 | Lee |
| 5,777,501 A | 7/1998 | AbouSeido |
| 5,778,214 A | 7/1998 | Taya et al. |
| 5,791,715 A | 8/1998 | Nebel |
| 5,796,313 A | 8/1998 | Eitan |
| 5,797,105 A | 8/1998 | Nakaya et al. |
| 5,811,983 A | 9/1998 | Lundberg |
| 5,880,608 A | 3/1999 | Mehta et al. |
| 5,894,419 A | 4/1999 | Galambos et al. |
| 5,926,050 A | 7/1999 | Proebsting |
| 5,963,043 A | 10/1999 | Nassif |
| 5,963,074 A | 10/1999 | Arkin |
| 5,969,543 A | 10/1999 | Erickson et al. |
| 5,977,763 A | 11/1999 | Loughmiller et al. |
| 5,982,211 A | 11/1999 | Ko |
| 6,011,403 A | 1/2000 | Gillette |
| 6,025,738 A | 2/2000 | Masleid |
| 6,028,490 A | 2/2000 | Komatsu |
| 6,031,403 A | 2/2000 | Gersbach |
| 6,069,506 A | 5/2000 | Miller, Jr. et al. |
| 6,087,886 A | 7/2000 | Ko |
| 6,111,447 A | 8/2000 | Ternullo, Jr. |
| 6,114,840 A | 9/2000 | Farrell et al. |
| 6,127,872 A | 10/2000 | Kumata |
| 6,154,099 A | 11/2000 | Suzuki et al. |
| 6,154,100 A | 11/2000 | Okamoto |
| 6,160,755 A | 12/2000 | Norman et al. |
| 6,172,545 B1 | 1/2001 | Ishii |
| 6,172,943 B1 | 1/2001 | Yuzuki |
| 6,188,260 B1 | 2/2001 | Stotz et al. |
| 6,198,334 B1 | 3/2001 | Tomobe et al. |
| 6,204,710 B1 | 3/2001 | Goetting et al. |
| 6,229,747 B1 | 5/2001 | Cho et al. |
| 6,242,936 B1 | 6/2001 | Ho et al. |
| 6,242,937 B1 | 6/2001 | Lee et al. |
| 6,262,601 B1 | 7/2001 | Chloe et al. |
| 6,275,091 B1 | 8/2001 | Saeki |
| 6,281,706 B1 | 8/2001 | Wert et al. |
| 6,285,230 B1 | 9/2001 | Na |
| 6,294,930 B1 | 9/2001 | Goetting et al. |
| 6,321,282 B1 | 11/2001 | Horowitz et al. |
| 6,323,706 B1 | 11/2001 | Stark et al. |
| 6,366,115 B1 | 4/2002 | DiTommaso |
| 6,407,571 B1 | 6/2002 | Furuya et al. |
| 6,426,641 B1 | 7/2002 | Koch et al. |
| 6,426,652 B1 | 7/2002 | Greenhill et al. |
| 6,455,901 B2 | 9/2002 | Kameyama et al. |
| 6,459,319 B2 | 10/2002 | Sako |
| 6,466,063 B2 | 10/2002 | Chen |
| 6,476,632 B1 | 11/2002 | La Rosa et al. |
| 6,489,796 B2 | 12/2002 | Tomishima |
| 6,518,809 B1 | 2/2003 | Kotra |
| 6,535,014 B2 | 3/2003 | Chetlur et al. |
| 6,538,471 B1 | 3/2003 | Stan et al. |
| 6,538,522 B1 | 3/2003 | Aipperspach et al. |
| 6,545,519 B1 | 4/2003 | Carballo |
| 6,570,407 B1 | 5/2003 | Sugisawa et al. |
| 6,573,777 B2 | 6/2003 | Saint-Laurent et al. |
| 6,577,157 B1 | 6/2003 | Cheung et al. |
| 6,577,176 B1 | 6/2003 | Masleid et al. |
| 6,621,318 B1 | 9/2003 | Burr |
| 6,657,504 B1 | 12/2003 | Deal et al. |
| 6,664,837 B1 | 12/2003 | Oh et al. |
| 6,690,242 B2 | 2/2004 | Fang et al. |
| 6,697,929 B1 | 2/2004 | Cherkauer et al. |
| 6,724,214 B2 | 4/2004 | Manna et al. |
| 6,731,140 B2 | 5/2004 | Masleid et al. |
| 6,731,179 B2 | 5/2004 | Abadeer et al. |
| 6,759,863 B2 | 7/2004 | Moore |
| 6,762,638 B2 | 7/2004 | Correale, Jr. et al. |
| 6,762,966 B1 | 7/2004 | LaRosa et al. |
| 6,768,363 B2 | 7/2004 | Yoo et al. |
| 6,774,734 B2 | 8/2004 | Christensen et al. |
| 6,798,230 B1 | 9/2004 | Taylor et al. |
| 6,815,971 B2 | 11/2004 | Wang et al. |
| 6,815,977 B2 | 11/2004 | Sabbavarapu et al. |
| 6,831,494 B1 | 12/2004 | Fu et al. |
| 6,879,200 B2 | 4/2005 | Komura et al. |
| 6,882,172 B1 | 4/2005 | Suzuki et al. |
| 6,885,210 B1 | 4/2005 | Suzuki |
| 6,903,564 B1 | 6/2005 | Suzuki |
| 6,924,669 B2 | 8/2005 | Itoh et al. |
| 7,053,660 B2 | 5/2006 | Itoh et al. |
| 7,053,680 B2 | 5/2006 | Masleid et al. |
| 7,119,580 B2 | 10/2006 | Masleid et al. |
| 7,142,018 B2 | 11/2006 | Masleid et al. |
| 7,173,455 B2 | 2/2007 | Masleid et al. |
| 7,239,170 B2 | 7/2007 | Suen et al. |
| 7,271,638 B2 | 9/2007 | Takai et al. |
| 7,295,041 B1 | 11/2007 | Masleid et al. |
| 7,304,503 B2 | 12/2007 | Masleid et al. |
| 7,336,103 B1 | 2/2008 | Masleid et al. |
| 2001/0000426 A1 | 4/2001 | Sung et al. |
| 2001/0028278 A1 | 10/2001 | Ooishi |
| 2001/0030561 A1 | 10/2001 | Asano et al. |
| 2001/0052623 A1 | 12/2001 | Kameyama et al. |
| 2002/0056016 A1 | 5/2002 | Horowitz et al. |
| 2002/0178415 A1 | 11/2002 | Saraf |
| 2003/0005775 A1 | 1/2003 | Washeleski et al. |
| 2003/0011413 A1 | 1/2003 | Masleid |
| 2003/0042960 A1 | 3/2003 | Gomm |
| 2003/0057775 A1 | 3/2003 | Yamashita et al. |
| 2003/0160630 A1 | 8/2003 | Earle |
| 2003/0189465 A1 | 10/2003 | Abadeer et al. |
| 2003/0231713 A1 | 12/2003 | Masleid et al. |
| 2004/0104731 A1 | 6/2004 | Vollertsen |
| 2004/0119501 A1 | 6/2004 | Sabbavarapu et al. |
| 2004/0119503 A1 | 6/2004 | Jamshidi et al. |
| 2004/0124900 A1 | 7/2004 | Brox |
| 2004/0148111 A1 | 7/2004 | Gauthier et al. |
| 2004/0257115 A1 | 12/2004 | Bertram et al. |
| 2005/0184720 A1 | 8/2005 | Bernstein et al. |
| 2005/0212547 A1 | 9/2005 | Suzuki |
| 2005/0248368 A1 | 11/2005 | Bertram et al. |

FOREIGN PATENT DOCUMENTS

| | | |
|---|---|---|
| JP | 03089624 | 4/1991 |
| JP | 4061516 | 3/1992 |
| JP | 06216723 | 8/1994 |

OTHER PUBLICATIONS

Lima, et al., Capitance Coupling Immune, Transient Sensitive Accelerator for Resistive Interconnect Signals of Subquarter Micron ULSI, Apr. 1996, IEEE Journal of Solid-State Circuits, vol. 31 No. 4, pp. 531-536.

Nalamalpu, et al., Boosters for Driving Long Onchip Interconnects-Design Issue, Interconnect Synthesis, and Comparison with Repeaters, Jan. 2002, IEEE Transactions on Computer-Aided Design of Integrated Circuits and Systems, vol. 21, No. 1, pp. 50-62.

Taub, et al., Digital Integrated Electronics, 1977, McGraw-Hill, Inc. pp. 98-100.

Chen, G et al., "DynamicNBTI of p-Mos Transistors and its Impact on MOSFET Scaling" IEE Electron Device Letters, 2002.

Oner et al., "A compact Monitoring Circuit for Real-Time On-Chip Diagnosis of Hot-Carrier Induced Degradation" Microelectronic test structures. Proceedings, IEEE International Conference in Monterey, Ca. Mar. 17, 1997-Mar. 20, 1997, pp. 72-76.

Peters, Laura. "NBTI: A Growing Threat to Device Reliability," Semiconductor International. Mar. 1, 2004 Http://www. reed-electronics.com/semiconductor/article/CA386329?industryid=3033.

Reddy. V. et al., "Impact of Negative Bias Temperature Instability on Digital Circuit Reliability". 2002 IEE International Reliabilty Physics Symposium Proceedings, Dallas, TX Apr. 7, 2002-Apr. 11, 2002.

Rhyne, "Fundamentals of Digital Systems Design", N.J. 1973, pp. 70-71.

Stojanovic, V. and Oklobdzija, V., "Comparative Analysis of Master-Slave Latches and Flip-Flops for High-Performance and Low-Power Systems", IEEE Journal of Solid-State Circuits, vol. 34, No. 4, Apr. 1999, pp. 536-548.

\* cited by examiner

US 7,768,295 B2

ADVANCED REPEATER UTILIZING SIGNAL DISTRIBUTION DELAY

CROSS-REFERENCE TO RELATED APPLICATIONS

This is a continuation of U.S. patent application Ser. No. 11/171,845, filed Jun. 30, 2005, which is a continuation-in-part of U.S. patent application Ser. No. 10/864,271, filed Jun. 8, 2004 and U.S. patent application Ser. No. 10/879,807 filed Jun. 28, 2004, each of which is hereby incorporated herein by reference in their entirety.

BACKGROUND OF THE INVENTION

A vital area of circuit performance is the propagation time of signals, for example synchronization or "clock" signals, across an integrated circuit. Longer wires in integrated circuits resist the propagation of signals due to the resistance and capacitance of the wire. The propagation of signals across a chip can be improved by inserting an amplification circuit, sometimes referred to as buffering or repeater insertion, into the wire.

SUMMARY OF THE INVENTION

Accordingly, a repeater circuit would be advantageous. Embodiments in accordance with the present invention provide an advanced repeater utilizing signal distribution delay.

An advanced repeater utilizing signal distribution delay is disclosed. In accordance with a first embodiment of the present invention, an advanced repeater circuit includes an output stage for driving an output signal line responsive to an input signal and a feedback loop coupled to the output signal line for changing state of the output stage subsequent to a delay after a transition of the output signal. The delay may be due to transmission line effects of the output signal line.

In accordance with another embodiment of the present invention, a method of assisting signal transitions includes receiving a transition at a circuit input and driving an output signal line responsive to the transition. Subsequent to a delay after a transition of the output signal line, the output signal line ceases to be driven. The delay may be produced substantially by transmission line effects of the output signal line.

BRIEF DESCRIPTION OF THE DRAWINGS

The accompanying drawings, which are incorporated in and form a part of this specification, illustrate embodiments of the present invention and, together with the description, serve to explain the principles of the invention. The drawings referred to in this description should not be understood as being drawn to scale except if specifically noted.

DETAILED DESCRIPTION OF THE INVENTION

Figure 1:
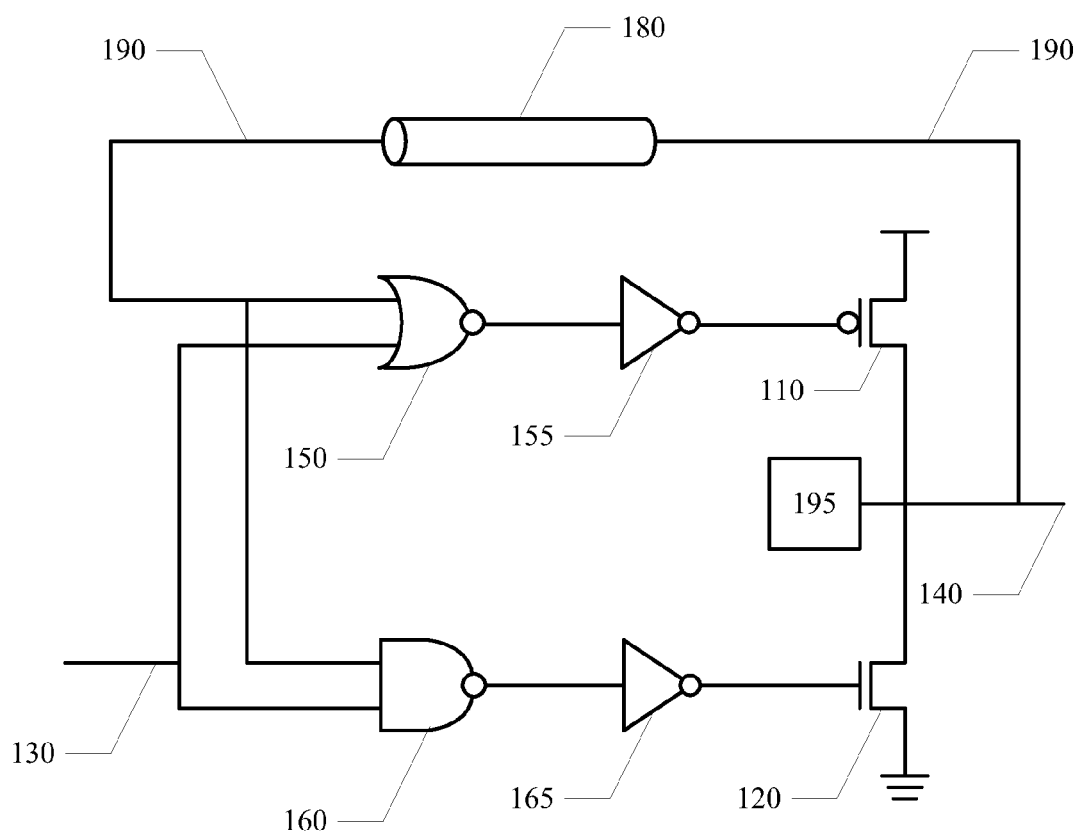
FIG. 1 illustrates a schematic of one embodiment of a circuit for driving signals on a wire and for assisting signal transitions, in accordance with embodiments of the present invention.

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

During the layout of an integrated circuit chip design, repeater circuits are inserted at periodic intervals along long metal wires in order to amplify signals (or remove distortion) as well as to reduce propagation delay (or maintain fast transition times). Synchronization timing or "clock" signal distribution networks, e.g., "clock trees," frequently utilize such repeaters. Typically, there is a wide selection of repeater circuits available to the integrated circuit designer.

Conventional, or "classic" repeater circuits generally comprise relatively simple amplifier circuits. An amplifier circuit receives a transition and actively drives its output to the new voltage state. A problem with such conventional repeaters is that, after helping achieve one transition, such circuits continue to drive the wire and thus resist the next transition.

A second general classification of a repeater circuit design is known as or referred to as an "advanced" repeater. An advanced repeater circuit generally utilizes a delayed version of the input signal in order to limit the duration that the output portion of the advanced repeater fully drives the output line. By limiting the "full drive" duration, the advanced repeater may enhance the propagation of a signal without resisting subsequent transitions.

One difficulty in designing advanced repeater circuits is selecting and controlling the duration of the delay. In order to ensure a high-quality waveform, the delay should be long enough for the output to transition to the power supply rail, e.g., be strongly driven. However, the delay should further be short enough such that the output driver turns off prior to the arrival of a subsequent input clock edge. Straightforward delay-generation techniques, e.g., a series of inverter elements, are frequently used to generate such delays in advanced repeater circuits.

Unfortunately, however, the delay durations generated by such delay-generation techniques suffer from both intentional and unavoidable variations in circuit operation due to such factors as manufacturing process variations and the effects of operating temperature and operating voltage variations. For example, if the delay becomes too short, e.g., due to variation in operating conditions, the output driver(s) may not have enough time to drive the output to the desired state. Additionally, the use of a plurality of circuit elements to achieve a desirable target delay may undesirably increase circuit complexity, cost and/or power consumption while deleteriously decreasing wireablility.

FIG. 1 illustrates a schematic of one embodiment of a circuit 100 for driving signals on a wire and for assisting signal transitions, in accordance with embodiments of the present invention. Circuit 100 can be coupled to a signal wire to function as a wire repeater or accelerator. As will be seen, circuit 100 provides the capability to detect a transition (e.g., a rising transition or falling transition) occurring on the wire and assist the transition, and then drive the wire after the transition without resisting a subsequent transition.

In the embodiment of FIG. 1, circuit 100 has an input node 130 and an output node 140 that are each coupled to the wire.

In general, circuit 100 of FIG. 1 includes three sections referred to herein as driver circuitry, control circuitry, and feedback loop. In the example of FIG. 1, the driver circuitry includes p-type device 110 and n-type device 120. NOR gate 150 and inverter 155 control p-type device 110 based upon input node 130 and a feedback loop input. It is appreciated that devices 150 and 155 in the present configuration form a logical OR gate or function. Similarly, NAND gate 160 and inverter 165 similarly control n-type device 120 based upon input node 130 and the feedback loop input. It is appreciated that devices 160 and 165 in the present configuration form a logical AND gate or function.

It is to be appreciated that feedback loop 190 is formed between output node 140 and the feedback inputs of devices 150 and 160.

Conventionally, feedback loop 190 may be schematically represented as an uninterrupted signal line, e.g., a direct connection between output node 140 and the feedback inputs of devices 150 and 160. However, such a schematic representation does not identify the high frequency physical effects influencing feedback loop 190. Consequently, feedback loop 190 is illustrated in FIG. 1 with lumped transmission line effects 180. It is to be appreciated that transmission line effects on feedback loop 190, shown as lumped transmission line effects 180, will introduce a delay between output node 140 and the feedback inputs of devices 150 and 160.

Exemplary operation of circuit 100 will now be described, assuming an initial condition of a low on input node 130 and a high on output node 140. In a steady-state condition, the high on output node 140 will have propagated to the feedback inputs of NOR 150 and NAND 160.

Responsive to a low to high transition on input node 130, there will be two high inputs to NAND 160 that ultimately turn on n-type device 120. Similarly, there will be two high inputs to NOR 150 that ultimately turn p-type device 110 off. Consequently, output node 140 will transition from high to low, being actively driven by n-type device 120.

The high to low transition on output node 140 will propagate through feedback loop 190. This transition will be delayed by transmission line effects on feedback loop 190, shown as lumped transmission line effects 180, ultimately reaching the feedback inputs of NOR 150 and NAND 160.

Responsive to the high to low transition on the feedback inputs of NOR 150 and NAND 160, both n-type device 120 and p-type device 110 will be turned off.

It is to be appreciated that output node 140 will tend to remain in its previous state, e.g., low in the previous example, even when not actively driven, e.g., when both n-type device 120 and p-type device 110 have been turned off. In accordance with alternative embodiments of the present invention, relatively weak "keeper" or "hold" circuitry 195 may be utilized to hold output node 140 in a steady state.

For example, such keeper circuitry 195 may operate at a reduced drive strength relative to the rising and falling transition circuitry. The keeper circuitry 195 maintains the state at the output node 140 in between operation of the transistors 110 and 120. That is, the keeper circuitry 195 maintains a high state at output node 140 after transistor 110 is shut off (and before transistor 120 is turned on), and also maintains a low state at output node 140 after transistor 120 is turned off (and before transistor 110 is turned on).

Co-pending, commonly owned U.S. patent application Ser. No. 10/879,807, filed Jun. 28, 2004, entitled "Circuits and Methods for Detecting and Assisting Wire Transitions" to Masleid and Kowalczyk, incorporated herein by reference in its entirety, illustrates exemplary circuits and methods of such "keeper" circuitry suitable for inclusion with embodiments of the present invention.

Utilization of a signal's own distribution delay as a control input in an advanced repeater type of signal buffer presents several advantages in comparison to the conventional art. For example, no additional, dedicated circuitry is required to generate the delay. Such a decrease in circuitry in comparison to the conventional art advantageously reduces cost and power consumption while also improving wireability.

It is to be appreciated that the delay should be sufficient for each drive transistor, e.g., transistors 110 and 120 (or set of drive transistors), to be able to drive the output network, represented by output node 140, to a desirable level. For example, if the delay is too short, the output network may not achieve a level consistent with the technology's defined levels. Likewise, if the delay is too long, the output driver will fail to shut off prior to the subsequent transition, effectively reducing the output drive strength and limiting the operating frequency of the circuit.

In yet another advantage of embodiments in accordance with the present invention, there will, in general, be a convenient signal node endpoint nearby with sufficient delay for use as the feedback input, since in most cases a clock distribution network or tree 190 conforms to a uniform and ubiquitous set of endpoints.

In addition, there are numerous electrical advantages. For example, since the delay is generated by the signal distribution network 190, the delay inherently tracks changes in the signal distribution. For example, if due to process variation the signal is distributed in a "fast" manner, the delay will be similarly affected and consequently reduced, enabling such "fast" signals.

Figure 2:
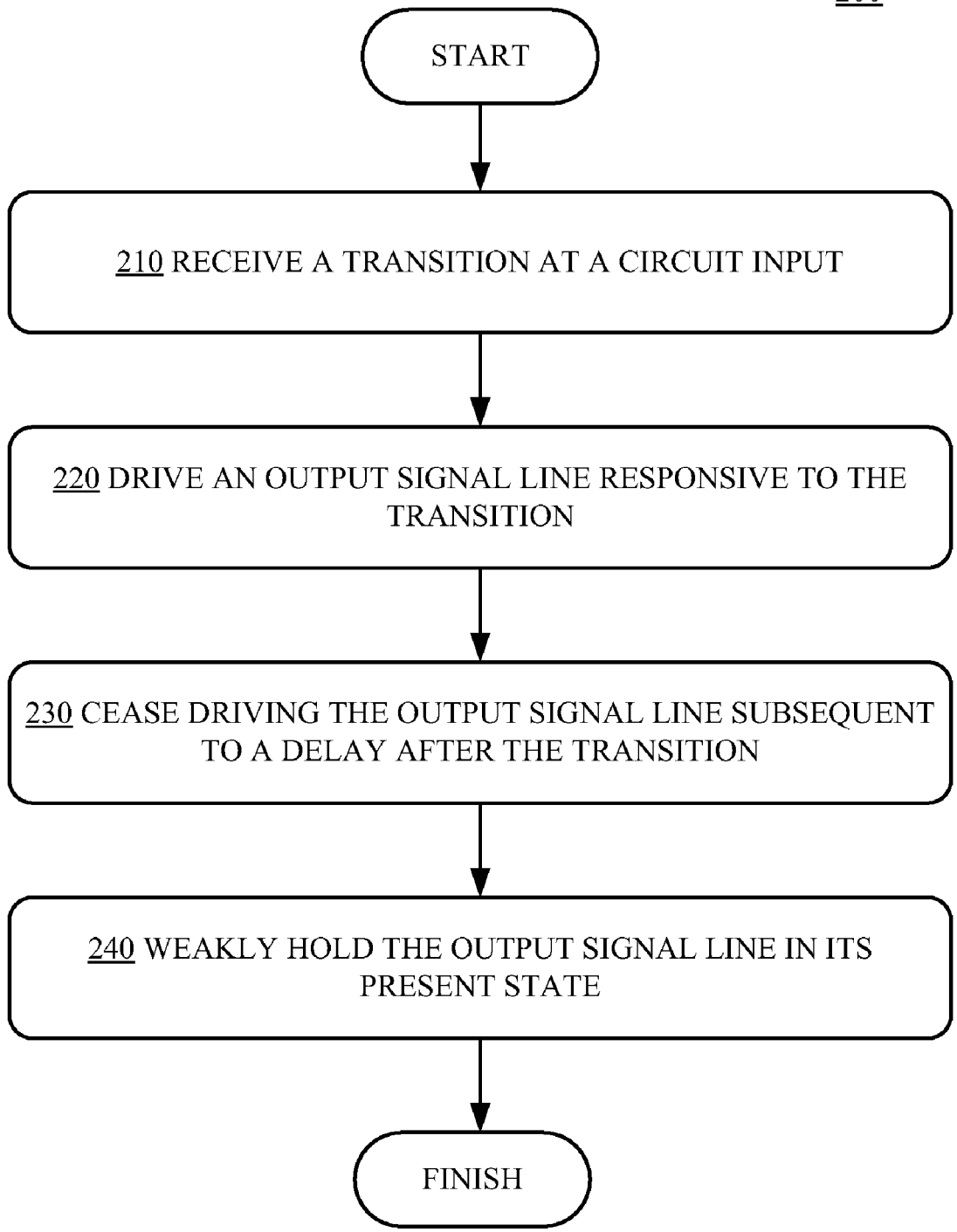
FIG. 2 illustrates a method for assisting signal transitions, in accordance with embodiments of the present invention.

FIG. 2 illustrates a method 200 for assisting signal transitions, in accordance with embodiments of the present invention. In 210, a transition is received at a circuit input. For example, a low to high transition is received at input node 130 as shown in FIG. 1.

In 220, an output signal line is driven responsive to the transition. For example, the low to high transition received at input node 130 propagates though the control circuitry of circuit 100 to cause n-type device 120 to turn on, driving output node 140 to a low level.

In 230, the driving ceases subsequent to a delay after the transition of the output signal line. The delay is produced substantially by transmission line effects of the output signal line. For example, the high to low transition on output node 140 propagates through feedback loop 190 and causes n-type device 120 to turn off after a delay.

It is appreciated that other circuitry may hold the output signal line in its present state subsequent to the cessation of driving, in accordance with alternative embodiments of the present invention. In optional 240, the output signal line is weakly held in its present state.

In summary, embodiments of the present invention provide circuits (e.g., wire accelerators and repeaters), and methods thereof, for assisting signal transitions on a wire (such as a wire on an integrated circuit). Circuit embodiments in accordance with the present invention can both drive a signal on the wire and assist during wire transitions, without resisting the transitions.

Embodiments in accordance with the present invention are thus described. While the present invention has been described in particular embodiments, it should be appreciated that the present invention should not be construed as limited by such embodiments, but rather construed according to the below claims.

What is claimed is:

1. A circuit comprising:
   a drive circuit for selective driving an output node of the circuit high and low;
   an OR gate having an output coupled to the drive circuit and a first input coupled to an input signal of the circuit;
   an AND gate having an output coupled to the drive circuit and a first input coupled to the input signal; and
   a non-inverting feedback loop coupled between the output node through an endpoint of a clock signal distribution network or tree to the second inputs of the OR gate and the AND gate, wherein the feedback loop includes a configuration to introduce a transmission line effect delay between the output node and the second inputs of the OR gate and the AND gate as a result of propagation from the output node to the endpoint of the clock signal distribution network or tree.

2. The circuit of claim 1, wherein the drive circuit comprises a p-type transistor and an n-type transistor, wherein the gate of the p-type transistor is coupled to the output of the OR gate and the gate of the n-type transistor is coupled to the output of the AND gate.

3. The circuit of claim 1, wherein the OR gate comprises a NOR gate and an inverter.

4. The circuit of claim 1, wherein the AND gate comprises a NAND gate and an inverter.

5. The circuit of claim 1, wherein the transmission line effect delay is sufficient for the drive circuit to drive the output node to a predetermined level.

6. The circuit of claim 1, further comprising a keeper circuit coupled to the output node.

7. A repeater circuit comprising:
   a driver circuit having an output coupled to an output node for driving the output node to a high and low state;
   a feedback loop, coupled between the output node through an endpoint of a clock signal distribution network or tree to a first input of a control circuit, wherein the clock signal distribution network or tree includes a configuration to introduce a transmission line effect delay between the output node and the first input of the control circuit; and
   the control circuit, having an output coupled to an input of the driver circuit and a second input coupled to an input node, and for causing the driver circuit to drive an output signal at the output node to a given one of the high or low state in response to a transition of an input signal at the input node and ceasing driving the output signal after the transmission line effect delay in response to a transition of the output signal.

8. The repeater circuit of claim 7, wherein the driver circuit comprises:
   a first transistor for driving the output node to the high state; and
   a second transistor for driving the output node to the low state.

9. The repeater circuit of claim 8, wherein the control circuit comprises:
   an OR gate, for controlling the first transistor, having a first input coupled to an input node and a second input coupled to the feedback loop; and
   an AND gate, for controlling the second transistor, having a first input coupled to the input node and a second input coupled to the feedback loop.

10. The repeater circuit of claim 7, further comprising a keeper circuit coupled to the output node for weakly holding the output signal in its present state.

11. The repeater circuit of claim 7, wherein the output signal is inverted relative to the input signal.

12. The repeater circuit of claim 7, wherein the transmission line effect delay is long enough to drive the output signal to a given level and short enough not to resist a next transition of the output signal.

13. The repeater circuit of claim 7, wherein the transmission line effect delay is short enough that the driver circuit stops driving the output signal prior to a next transition of the input signal.

14. A repeater circuit comprising:
   a means for receiving an input signal; and
   a means for driving an output signal to a given one of a high and a low state in response to a transition of the input signal and for ceasing driving the output signal after a delay in response to a transition of the output signal, wherein the delay is produced substantially by transmission line effects of propagation of the output signal to an endpoint of a clock signal distribution network coupled to the repeater circuit.

15. The repeater circuit of claim 14, wherein the delay is long enough to drive the output signal to a given level on the transmission line and short enough not to resist a next transition of the output signal.

* * * * *